US006939735B2

(12) United States Patent
Smith et al.

(10) Patent No.: US 6,939,735 B2
(45) Date of Patent: Sep. 6, 2005

(54) MICROELECTRONIC ASSEMBLY FORMATION WITH RELEASABLE LEADS

(75) Inventors: John W. Smith, Horseshoe Bay, TX (US); Mitchell Koblis, Los Banos, CA (US)

(73) Assignee: Tessera Inc., San Jose, CA (US)

( * ) Notice: Subject to any disclaimer, the term of this patent is extended or adjusted under 35 U.S.C. 154(b) by 483 days.

(21) Appl. No.: 10/235,102

(22) Filed: Sep. 5, 2002

(65) Prior Publication Data

US 2003/0075358 A1 Apr. 24, 2003

Related U.S. Application Data

(60) Provisional application No. 60/318,725, filed on Sep. 13, 2001.

(51) Int. Cl.[7] ......................... H01L 21/48; H01L 21/44; H01L 21/302; H01L 23/48; H01L 23/52

(52) U.S. Cl. ....................... 438/106; 438/118; 438/127; 438/617; 438/739; 257/692; 257/674; 257/784; 257/E23.068; 257/E23.069

(58) Field of Search ................................ 438/117, 118, 438/55, 106, 127, 126, 689, 617, 739; 257/E23.068, E23.069, 674, 692, 784

(56) References Cited

U.S. PATENT DOCUMENTS

| | | | | | |
|---|---|---|---|---|---|
| 5,089,337 | A | * | 2/1992 | Hochfeld | 428/352 |
| 5,127,570 | A | * | 7/1992 | Steitz et al. | 228/103 |
| 5,173,055 | A | * | 12/1992 | Grabbe | 439/66 |
| 5,398,863 | A | * | 3/1995 | Grube et al. | 228/106 |
| 5,518,964 | A | | 5/1996 | DiStefano et al. | |
| 5,578,286 | A | | 11/1996 | Martin et al. | |
| 5,650,914 | A | * | 7/1997 | DiStefano et al. | 361/704 |
| 5,679,977 | A | * | 10/1997 | Khandros et al. | 257/692 |
| 5,688,716 | A | | 11/1997 | DiStefano et al. | |
| 5,763,941 | A | | 6/1998 | Fjelstad | |
| 5,830,782 | A | | 11/1998 | Smith et al. | |
| 5,913,109 | A | | 6/1999 | Distefano et al. | |
| 5,915,752 | A | | 6/1999 | DiStefano et al. | |
| 5,929,517 | A | * | 7/1999 | Distefano et al. | 257/707 |
| 5,989,936 | A | * | 11/1999 | Smith et al. | 438/106 |
| 6,054,756 | A | | 4/2000 | DiStefano et al. | |
| 6,117,694 | A | | 9/2000 | Smith et al. | |
| 6,228,686 | B1 | | 5/2001 | Smith et al. | |
| 6,333,207 | B1 | | 12/2001 | Light et al. | |
| 6,361,959 | B1 | | 3/2002 | Beroz et al. | |
| 6,423,907 | B1 | | 7/2002 | Haba et al. | |
| 6,429,112 | B1 | | 8/2002 | Smith et al. | |
| 6,461,892 | B2 | * | 10/2002 | Beroz | 438/106 |
| 6,572,781 | B2 | * | 6/2003 | Haba | 216/33 |

OTHER PUBLICATIONS

Provisional U.S. Appl. No. 60/204,735, filed May 16, 2000.
U.S. Appl. No. 09/858,770, filed May 16, 2001.

* cited by examiner

*Primary Examiner*—Michael S. Lebentritt
*Assistant Examiner*—Ron Pompey
(74) *Attorney, Agent, or Firm*—Lerner, David, Littenberg, Krumholz & Mentlik, LLP

(57) ABSTRACT

A first microelectronic element is provided with leads having anchor ends connected to contacts and tip ends moveable with respect to the first microelectronic element. The leads can be provided on a carrier sheet that is assembled to the first microelectronic element, or may be formed in situ on the surface of the first element. The leads may be unitary strips of a conductive material, and the anchor ends of the leads may be bonded to the contacts of the first microelectronic element by processes such as thermosonic or ultrasonic bonding. Alternatively, stub leads may be provided on a separate carrier sheet or formed in situ on the front surface of the first microelectronic element, and these stub leads may be connected by wire bonds to the contacts of the first microelectronic element so as to form composite leads. The tip ends of the leads are joined to a second microelectronic element that is moved away from the first microelectronic element so as to deform the leads.

30 Claims, 9 Drawing Sheets

MICROELECTRONIC ASSEMBLY FORMATION WITH RELEASABLE LEADS

CROSS-REFERENCE TO RELATED APPLICATIONS

The present application claims benefit of U.S. Provisional Patent Application No. 60/318,725 filed Sep. 13, 2001, the disclosure of which is incorporated by reference herein.

BACKGROUND OF THE INVENTION

The present invention relates to microelectronic packaging and more particularly relates to connection components and methods for packaging microelectronic elements such as semiconductor chips, wafers, and other elements.

As illustrated in certain preferred embodiments of U.S. Pat. No. 5,518,964 ("the '964 Patent") movable interconnections between a microelectronic elements such as a semiconductor chip or wafer and another element can be provided by providing a connection component incorporating a dielectric body and leads extending on the bottom surface of the dielectric body. The leads may have first or fixed ends permanently attached to the dielectric body and connected to electrically conductive features such as terminals, traces or the like on the dielectric body. The leads also may have second or tip ends releasably attached to the dielectric body. The dielectric body, with the leads thereon, may be juxtaposed with the microelectronic element and the second or tip ends of the leads may be bonded to contacts on the microelectronic element. After bonding, the dielectric body and the microelectronic element are moved away from one another, thereby deforming the leads to a vertically extensive disposition. A curable liquid material may be introduced between the dielectric body and the microelectronic element during or after the moving step and cured to form a compliant dielectric layer as, for example, an elastomer or a gel surrounding the leads.

The resulting packaged microelectronic element has terminals on the dielectric body of the connection component which are electrically connected to the contacts on the chip but which can move relative to microelectronic element so as to compensate for thermal effects. For example, a semiconductor chip packaged in this manner may be mounted to a circuit board by solder-bonding the terminals to conductive features of the circuit board. Relative movement between the circuit board and the chip due to thermal effects is taken up in the movable interconnection provided by the leads and the compliant layer. Many variations of these processes and structures are disclosed in the '964 patent and the entire disclosure of such patent is incorporated herein by reference. Merely by way of example, the package-forming process can be conducted on a wafer level, so that numerous semiconductor chips in unitary wafer are connected to connection components in one operation or in one sequence of operations.

Additional variations and improvements of the process taught in the '964 patent are disclosed in commonly assigned U.S. Pat. Nos. 5,578,286; 5,830,782; 5,688,716; and 5,913,109.

A further variant of the process taught in the '964 patent is described in certain embodiments of co-pending, commonly assigned U.S. patent application Ser. No. 09/271,688, filed Mar. 18, 1999. [136 II CIP] In these embodiments, a microelectronic component such as a wafer including one or more semiconductor chips and having contacts on a front surface may be provided with leads by forming the leads in place on the semiconductor element so that the leads overlie the front surface. The formed leads desirably have contact ends connected to the contacts and have tip ends releasably connected to the semiconductor element. The semiconductor element, with the leads thereon, is juxtaposed with a further element such as a support and/or dielectric element having pads thereon. The tip ends of the leads are bonded to the pads. Following the bonding step, the chip or wafer can be moved away from one another so as to bend the leads toward a vertically-extensive disposition. Most preferably, the pads are wider than the ends of the leads connected to the pads. For example, the pads may be in the form of linear features extending transverse to the tip ends of the leads. Where the leads on the chips are aligned to pads wider than the ends of the leads, the process can operate satisfactorily even with a relatively large alignment tolerance between the chip or wafer and the element bearing the pads.

As described in certain preferred embodiments of the co-pending, commonly assigned U.S. Pat. No. 6,117,694; U.S. patent application Ser. No. and 09/317,675, filed May 24, 1999, and U.S. Pat. No. 6,228,686, a connection component may be provided as a sheet of a dielectric material with a main region and with lead regions defined by slots extending through the sheet. Such slots extend partially around each such lead region, so that a tip end of each lead region is movable relative to the main region. Where terminals on the main region of the sheet are connected to one element and the tip ends of the leads are connected to another element, the lead regions can be bent out of the plane of the sheet to form vertically extensive leads by moving the elements away from one another. As described in certain preferred embodiments of U.S. Provisional Application No. 60/204,735 filed May 16, 2000, and the corresponding non-provisional U.S. patent application Ser. No. 09/858,770 filed May 16, 2001, such a sheet can be formed in whole or in part on the surface of a microelectronic element such as a wafer. The disclosures of all of the aforesaid patents and applications are hereby incorporated by reference herein.

Despite these improvements in the art, still further improvements and variations would be desirable.

SUMMARY OF THE INVENTION

One aspect of the invention includes methods of providing leads on a first microelectronic element such as a wafer having a body with a top surface and a plurality of contacts exposed at the front surface. The method according to this aspect of the invention desirably includes assembling a carrier sheet formed separately from the microelectronic element to the top surface of the microelectronic element. The carrier sheet has a bottom surface and a top surface. The carrier sheet is assembled to the first microelectronic element so that the bottom surface of the carrier sheet faces toward the top surface of the first microelectronic element. At the time the carrier sheet is assembled to the microelectronic element, the carrier sheet desirably has leads overlying its top surface. The leads have tip ends that are displaceable upwardly with respect to the carrier sheet.

The method desirably further includes securing the carrier sheet to the top surface of the microelectronic element and electrically connecting at least some of said the leads to at least some of the contacts on said first microelectronic element. The net result is to provide a subassembly including the first microelectronic element and the carrier sheet, with the leads thereon.

A method of making microelectronic assemblies according to a further aspect of the invention uses such a subassembly. The method according to this aspect of the invention includes the additional steps of connecting at least some of the tip ends of the leads on the carrier sheet to a second microelectronic element overlying the top surface of said carrier sheet, and then moving the second microelectronic element vertically relative to the carrier sheet and first microelectronic element so as to move the tip ends of the leads upwardly away from the carrier sheet.

Using a subassembly of the carrier sheet and microelectronic element or wafer avoids the need to align the first and second microelectronic elements with one another with the precision required to make connections to the contacts on the wafer. Although precision is required when connecting the leads to the contacts during formation of the subassembly, it is considerably easier to achieve the required level of precision at this stage of the process, when the second element is not present.

By providing the leads in a carrier sheet separate from the microelectronic element or wafer, processes according to this aspect of the invention eliminate any need to put the wafer through lead-forming processes, and allow fabrication of the leads in a separate process that can be performed without constraints imposed by presence of the wafer. Processes according to preferred embodiments of the foregoing aspects of the invention can be performed using simple and economical carrier sheets, as, for example, carrier sheets having metallic features on only the top surface of the dielectric layer. Structures having metallic features on only a single surface of a dielectric layer commonly are referred to as "one-metal" structures; they are considerably less expensive than comparable structures with features such as metal leads on two surfaces and/or metal-lined holes extending through the dielectric layer.

At least some of the leads which are on the carrier sheet when it is assembled to the first microelectronic element may be full leads having anchor ends remote from the tip ends of the leads, and the step of electrically connecting at least some of the leads to the contacts may include bonding the anchor ends of at least some of said full leads to at least some of the contacts.

The step of bonding the anchor ends the leads to the contacts may be performed by bonding plural anchor ends to plural contacts simultaneously. For example, when the carrier sheet is assembled to the first microelectronic element, a bonding material may be present on at least some of the contacts; on at least some of said anchor ends; or both. In this case, the step of bonding the anchor ends to the contacts desirably includes activating the bonding material. The bonding material may include solder or may include gold bumps on the contacts or on the anchor ends. As further discussed below, gold bumps can be provided on closely-spaced contacts of a wafer, using conventional technology during or after production of the wafer.

During the step of moving the first and second elements away from one another after bonding the tip ends, at least some of the full leads may be entirely detached from the carrier sheet. This provides a vertically-extensive lead that is free to flex in service over its entire length, between its anchor end and its tip end.

The step of bonding the anchor ends of the leads to at least the contacts may include bending the anchor ends of the leads downwardly into apertures in the carrier sheet towards the contacts. For example, the anchor ends of the leads may be bonded to the contacts on the wafer using processes such as sonic or thermosonic bonding. Where the lead is entirely detached from the carrier sheet, the downwardly-bent portion of the lead resulting from the bonding process forms a part of the vertically-extensive lead which desirably is free to flex relative to the first microelectronic element in the finished product.

Most preferably, the second microelectronic element is not present at the time the anchor ends are bonded to the contacts on the first microelectronic element. Thus, the step of bonding the anchor ends to the first microelectronic element may be performed readily.

A further aspect of the present invention provides additional methods of making microelectronic assemblies. A method in accordance with this aspect of the invention includes the step of providing a sheet overlying a front surface of a first microelectronic element. The sheet has leads on a top surface facing away from the first microelectronic element. The sheet and leads according to this aspect of the invention may be provided separately or may be formed in situ, on the surface of the first microelectronic element. At least some of the leads have anchor ends which project downwardly into apertures in the sheet and which are bonded to contacts of the first microelectronic element within such apertures. A method according to this aspect of the invention desirably further includes the step of connecting at least some of the tip ends of the leads to a second microelectronic element and then moving the microelectronic element vertically relative to the subassembly of the sheet and first microelectronic element so as to move the tip ends of the leads upwardly away from the sheet and the first microelectronic element. Most preferably, at least some of the leads are entirely detached from the sheet during the moving step. Thus, after the moving step, the full lengths of these leads, between their tip ends and anchor ends are detached from the microelectronic elements and hence are available for flexing to accommodate relative movement of these elements. As further explained below, the detached and deformed leads may include elongated conductive strips with a unique, multi-section configuration incorporating a bend point adjacent the anchor end of the lead and the contact of the first microelectronic element.

A further aspect of the present invention provides a microelectronic assembly incorporating first and second microelectronic elements, the second microelectronic element overlying a front surface of the first element, along with a plurality of leads having anchor ends connected to contacts on the first microelectronic element and having tip ends electrically connected to the second microelectronic element. At least some of the leads are multi-section leads, each including a unitary elongated strip sloping in the vertical direction towards the second microelectronic element from its anchor end to its tip end and having a bend point at which the slope changes more rapidly than in surrounding regions, such bend point being disposed adjacent the anchor end of the strip. Stated another way, the magnitude of the second derivative of vertical position with horizontal distance from the contact increases at the bend point and then decreases. Most preferably, each of these leads is entirely detached from the sheet, so that the entire elongated strip, on both sides of the bend point is substantially unconstrained in bending.

Yet another aspect of the invention provides further methods of making microelectronic assemblies. Here again, a method according to this aspect of the invention includes the step of providing a sheet overlying a front surface of a first microelectronic element, the sheet, having leads on a top surface facing away from the first microelectronic element. In this aspect of the invention as well, the sheet may be provided as a separate element with the leads thereon or may be formed in situ on the front face of the first microelectronic element. At least some of the leads, and preferably all of the leads, have tip ends that are releasably connected to the sheet, and have anchor ends remote from the tip ends. A method according to this aspect of the invention desirably includes the step of connecting the anchor ends of the leads to the contacts on the chip by engaging individual ones of the anchor ends with a tool as, for example, a sonic or thermosonic bonding tool and bonding each anchor end to a contact. This step may be performed by engaging each of the leads with the bonding tool individually, so that the various leads are engaged by the tool seriatim. Preferably, the step of bonding each anchor end to a contact includes bending the anchor end downwardly into the aperture in the sheet. A method according to this aspect of the invention desirably includes the further step of connecting at least some of the tip ends of the leads to a second microelectronic element and moving the second microelectronic element relative to the subassembly of the sheet and first microelectronic element as discussed above. In a method according to this aspect of the invention, connections between the anchor ends of the leads and the contacts of the first microelectronic element can be made readily before assembling the second microelectronic element with the subassembly.

Yet another aspect of the invention provides still further methods of making microelectronic assemblies. Methods according to this aspect of the invention include the step of providing a sheet overlying the front surface of the first microelectronic element. The sheet has stub leads on a top surface facing away from the first microelectronic element. Each stub lead includes a tip end and a bonding terminal offset from the tip end. The tip ends and, most preferably, the entirety of each stub lead are displaceable from the sheet. Here, again, the sheet may be provided as a separate element and assembled to the first microelectronic element, or may be formed in situ on the first microelectronic element. A method according to this aspect of the invention desirably includes the step of connecting additional lead portions separate from the sheet and the stub leads between the bonding terminals of at least some of the stub leads and at least some of the contacts of the first microelectronic element so as to form composite leads extending between the contacts and the tip ends. For example, the additional lead portions may be wires provided by a wire-bonding process. Methods according to this aspect of the invention desirably further include the step of connecting at least some of the tip ends of the stub leads to a second microelectronic element, thereby connecting the composite leads to the second microelectronic element, and then moving the second microelectronic element vertically relative to the subassembly of the sheet and the first microelectronic element, so as to move the tip ends of the composite leads upwardly away from the sheet and the first microelectronic element. Methods according to this aspect of the invention permit fabrication of subassemblies using wire bonding equipment that is already installed in numerous microelectronic packaging plants.

The step of connecting the tip ends of the leads to a second microelectronic element may include the step of advancing the second microelectronic element towards the sheet and the first microelectronic element, so that the second microelectronic element engages and deforms at least some of the additional lead portions during the advancing step. For example, the additional lead portions may be formed as wire bonds with loops projecting upwardly away from the stub leads and arcing downwardly towards the chip contacts. During the step of advancing the second element towards the first element and sheet, the second element may engage the upper portions of these loops and deform the same downwardly. This allows the use of relatively long wire bonds or other additional lead portions. As further explained below, in the completed assembly, such long additional lead portions remain slack and provide a connection with good resistance to failure during fabrication and use.

A related aspect of the present invention provides microelectronic assemblies. Microelectronic assemblies in accordance with this aspect of the invention include first and second microelectronic elements. The first element has a front surface and contacts exposed at the front surface. The second element overlies the front surface of the first element. The assembly in accordance with this aspect of the invention includes a plurality of leads. At least some of these leads are composite leads. Each such composite lead includes a stub end having a bonding terminal and a tip end electrically connected to the second microelectronic element. Each composite lead also includes an additional lead portion formed separately from the stub lead and bonded to the bonding terminal of the stub lead. The additional lead portion of each composite lead extends to a contact on the first microelectronic element. The stub leads are elevated above the first microelectronic element. Desirably, the stub leads are physically connected to the first microelectronic element only by the additional lead portions and by an encapsulant surrounding the composite leads. The preferred assemblies in accordance with this aspect of the present invention provide vertically extensive leads that incorporate additional lead portions in forms such as round wires that have substantial resistance to flex fatigue.

These and other objects, features and advantages of the present invention will be more readily apparent from the detailed description of the preferred embodiment set forth below, taken in conjunction with the accompanying drawings.

DETAILED DESCRIPTION OF THE PREFERRED EMBODIMENTS

Figure 1:
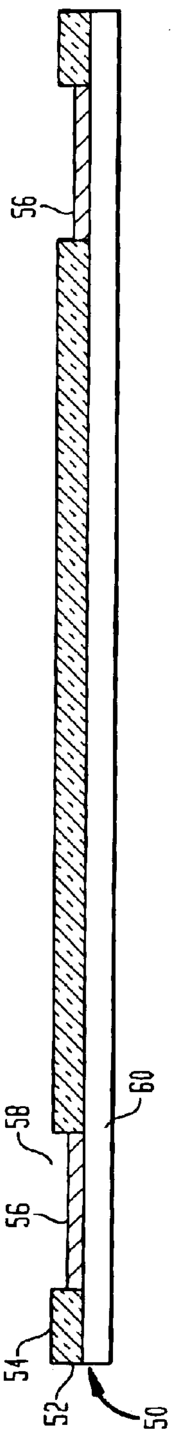
FIG. 1 is a diagrammatic sectional view of components utilized in a method according to one embodiment of the invention.

A method in accordance with one embodiment of the invention utilizes a first microelectronic element 50 in the form of a conventional semiconductor wafer. The wafer includes a passivation layer 52 defining the front surface 54 of the wafer. The passivation layer is a conventional dielectric material such as, for example, a polymer provided to protect the sensitive electrical components and conductive elements within wafer 50. The thickness of the passivation layer relative to the remaining portion of the wafer is greatly exaggerated in FIG. 1. The wafer has electrical contacts 56 exposed to top surface 54 through apertures 58 in the passivation layer. Only a small portion of the wafer is depicted in FIG. 1. A typical wafer includes numerous individual regions, each of which includes an array of electrical components and numerous contacts associated with those components. The wafer also has a rear surface 60.

Figure 2:
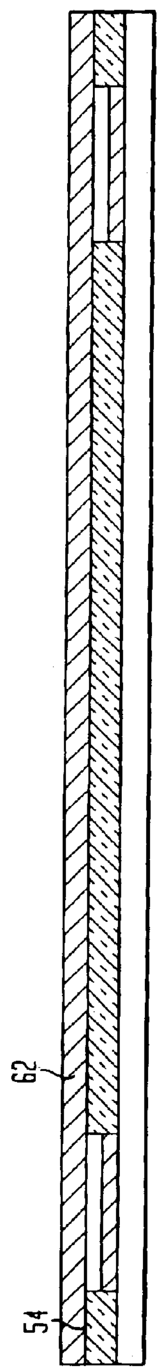
FIGS. 2–7 are views similar to FIG. 1, but depicting the components at later stages of the method.
Figure 3:
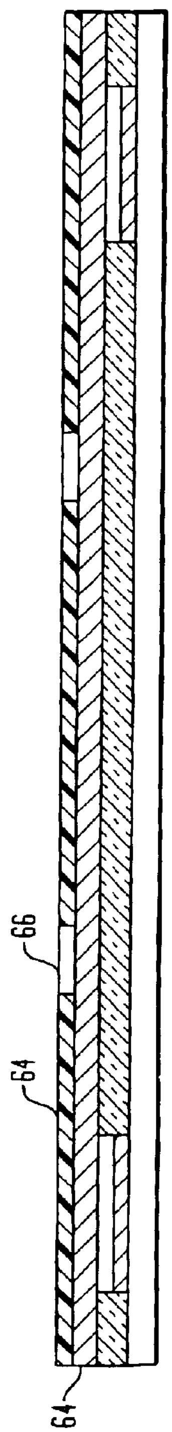

In a first stage of the method, a metallic foil 62 (FIG. 2) is laminated onto the front surface 54 of the wafer. Foil 62 may be formed from a conductive metal such as copper, or from a laminate including plural metallic layers. Following lamination, a resist layer 64 (FIG. 3) is provided over the metallic foil 62. Resist layer 64 has openings 66 formed therein. A bonding metal as, for example, a eutectic bonding alloy, diffusion bonding alloy, or low-melting material such as indium, solder or the like, is deposited into opening 66 so as to form small spots of bonding material.

Figure 4:
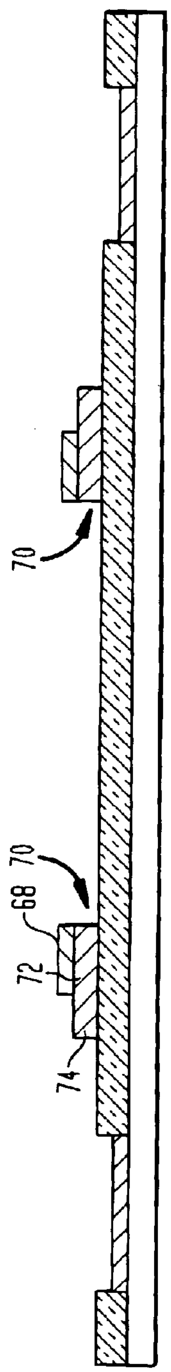

After application of the bonding material, foil 64 is selectively etched so as to leave stub leads 70 (FIG. 4) at pre-selected locations on the surface of passivation layer 54. Each stub lead 70 includes a tip end 72 and a bonding pad 74 horizontally offset from the tip end. As used in this disclosure, the term "horizontal" refers to directions in the plane of the wafer front surface, whereas the term "vertical" refers to directions transverse to such plane. The etching process used to form the stub leads may include application and patterning of a further resist (not shown). In the next stage of the process (FIG. 5), wire bonds 76 are applied between contacts 56 of the wafer and bonding pads 74 of the stub leads so as to form composite leads 78, each incorporating one wire bond 76 and one stub lead 70. Each composite lead 78 has a tip end 72 corresponding to the tip end of the stub lead and has an anchor end 80 formed by the bonding wire connected to the contact of the chip.

The wire bonds may be applied by conventional wire bonding equipment. As is well known in the art, conventional wire bonding equipment includes a head which dispenses a fine wire as, for example, a gold or aluminum wire. The bonding head is applied so as to form a bond at the bonding pad 74 of the stub lead and then moved upwardly away from the stub lead and downwardly toward the contact 56 while dispensing wire, so as to form the dispensed wire into the arcuate configuration illustrated in FIG. 5. After bonding the wire to the contact, the bonding head is actuated to break or flame the wire, thereby detaching the wire in the head from the dispensed lead 76. The reverse direction of motion—starting at the contact 56 and ending at bonding terminals 74—also may be used.

The passivation layer 52 is then etched as, for example, by exposing the front surface 54 to a plasma etchant. During this process, those portions of polymeric layer 52 that are disposed below stub leads 70 are protected from the etchant. Thus, etching of those portions begins at the edges of the stub leads and progresses gradually towards the middle of the stub leads. The etching process is terminated before that portion of the polymeric layer underlying each stub lead is completely removed, so as to leave small polymeric connecting elements 78 connecting the various stub leads to the remaining portion of layer 52. Each such connecting element has horizontal dimensions smaller than the horizontal dimensions of the stub lead. Such a partial etching process may be substantially the same as that disclosed in copending, commonly assigned U.S. Pat. No. 6,423,907, the disclosure of which is hereby incorporated by reference herein. The etching process leaves each stub lead 70, and hence the tip end 72 of each composite lead 78, connected to the dielectric layer 52 by frangible connecting element 82 having horizontal dimensions smaller than the horizontal dimensions of the associated stub lead 70.

In the next stage of the process (FIG. 6), a second microelectronic element 84 is employed. Second element 84 has a bottom face 88 and has electrically conductive bonding pads 90 exposed at the bottom face 88. In the particular arrangement illustrated in FIG. 6, the second element is a connection component that has a top face 92 with terminals 94 exposed at the top face 92. The terminals may be recessed relative to the top face, flush with the top face, or projecting from the top face. The terminals 94 are arranged for bonding to an external circuit such as a circuit board and carry bonding material such as solder balls 96 thereon. Second element 84 may include one or more layers of dielectric material, and may have electrically conductive elements such as traces 98 and vias (not shown) extending in or on the dielectric layers so as to connect the bonding pads 90 with terminals 94. Second element 84 may be in the form of a flexible, sheet-like element. The dielectric layers may be of the same type commonly used for forming flexible printed circuits and may include, for example, resins such as polymide, BT resin or the like. Alternatively, the second microelectronic element may include one or more layers of a relatively rigid dielectric material as, for example, a ceramic or glass structure. The second microelectronic element also may include other electrically conductive elements as, for example, electrically conductive plane structures extending over one or more external or internal surfaces of the layer so as to provide shielding, ground connections or power connections.

The second microelectronic element is juxtaposed with the first microelectronic element 50 so that the inner or bottom surface 88 of the second microelectronic element faces toward the front surface 54 of the first microelectronic element and so that the bonding pads 90 on the second microelectronic element are aligned with the tip end 72 of the composite leads and are aligned with the bonding material masses 68 on the tip ends.

Figures 5, 6, 7:
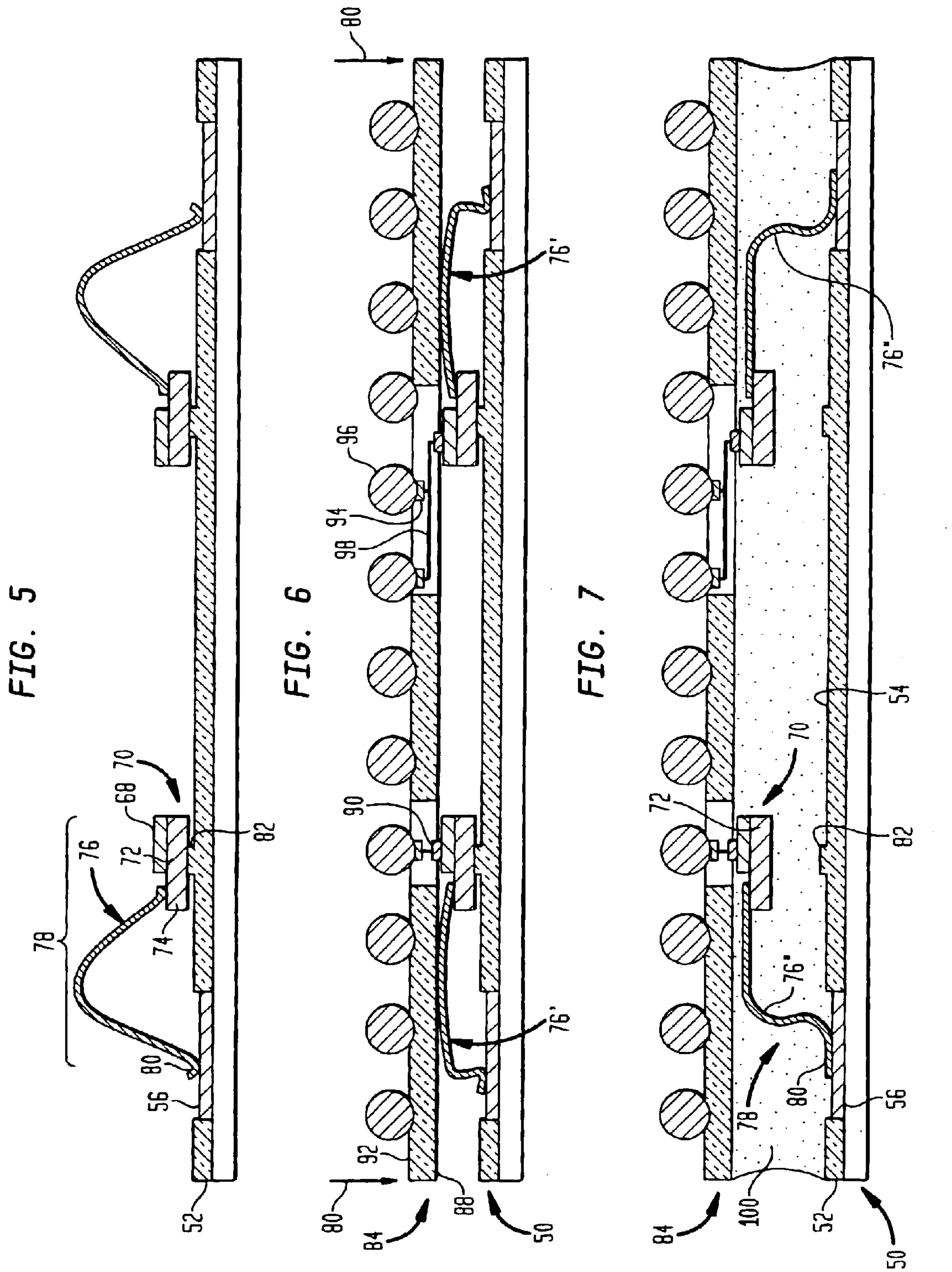
Figure 8:
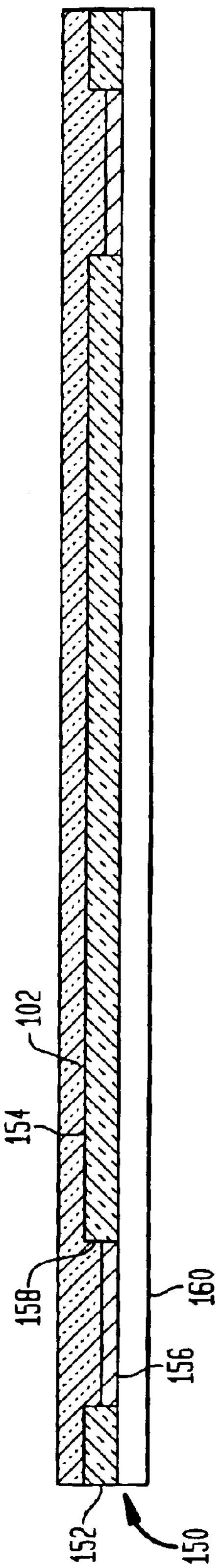
FIGS. 8–13 are views similar to FIG. 1, but depicting components used in a method according to another embodiment of the invention, at successive stages of that method.
Figure 9:
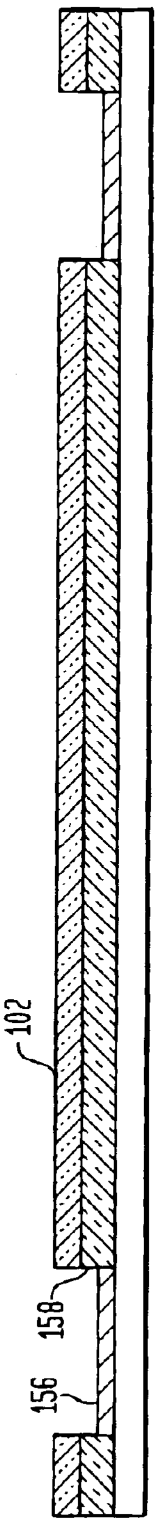

Second element 84 is advanced downwardly relative to the first microelectronic element 50, so that the second microelectronic element approaches the first element from the front as indicated by arrows 86 in FIG. 6. The relative motion is significant to the process, but which element moves relative to the surroundings is unimportant; only the second element, only the first element, or both elements may move relative to the surroundings. As the second element is advanced toward the first element, the bottom surface of the second element encounters the upwardly projecting portions of wire bonds 76 incorporated in composite leads 78 and deforms the wire bonds and, hence, the composite leads to the position indicated at 76' in FIG. 6. Thus, the wire bonds are squashed downwardly towards the front surface 54 of the first element. As the second element is moved downwardly toward the first element, the bonding pads 90 on the second element engage the bonding material 68 on the tip ends 72 of the leads. The bonding material may be activated as, for example, by heating it during this process. The activated bonding material forms bonds between the tip ends 72 of the leads and the contact pads 90 on the second element.

In the next stage of the process, the second element 84 is moved upwardly relatively to the first element 50. Here, again, the relative motion of the elements, rather than the motion of any particular element relative to the surroundings, is significant. Desirably, movement of the first and second elements towards and away from one another is controlled so that the elements move through a controlled, pre-determined displacement away from one another. For example, the elements may be constrained by fixtures such as platens moved by conventional mechanical linkages. The upward motion of the second element moves the tip ends 70 away from the first element 50, thereby bending the composite leads, and particularly the wire bonds 76 to a vertically extensive configuration indicated at 76" in FIG. 7. The vertical motion desirably does not bring the wire bonds to a completely taut condition. Rather, each wire bond desirably has some slack after the vertical motion. During this process, the stub leads 70 are detached from the front face 54 of the first element, breaking the small polymeric connectors 82 or by detaching these from the stub leads or from the remainder of the polymeric layer 52. Because each connector 82 has a relatively small horizontal area, only a limited force is required to detach the stub leads from the first element. For example, the dimensions of connectors 82 may be selected so that about 0.25 to about 4 grams ($0.25\times10^3$ to $4\times10^3$ dynes) of upwardly directed force is required to detach each stub lead from first element 50. As the second element moves upwardly away from the first element through a controlled pre-selected displacement, the composite leads are bent to the vertically extensive dispositions illustrated in FIG. 7. Each additional lead portion or wire bond 76" remains curved and hence slack. The anchor ends 80 of the composite leads remain connected to contacts 56. In the deformed condition illustrated in FIG. 7, the composite leads 78 are flexible and, hence, allow movement of the second element 84 relative to the first element 50.

An encapsulant 100 may be introduced into the space between the elements so as to surround the composite leads 78 during or after movement of the second element away from the first element. The encapsulant may be cured to form a layer surrounding the leads. For example, such a layer may be a compliant layer such as a gel or elastomer. The encapsulant may be introduced under pressure so that the pressure of the encapsulant impels the first and second elements away from one another during the movement step. After the leads have been deformed to the vertically extensive disposition shown in FIG. 7, the first and second elements may be severed or subdivided so as to form individual units, each such unit including one or more semiconductor chips and portions of the second element associated with those chips. For example, each individual unit may include a single semiconductor chip. Such a single chip provides a packaged semiconductor chip that can be mounted to a circuit board or other circuit panel by conventional surface mounting techniques using the bonding material 96 carried on terminals 94. In a variant of this process, each unit includes plural chips and the second microelectronic element interconnects the chips with one another, so that each unit constitutes a multi-chip module.

The process can be varied in numerous ways. For example, bonding material 96 may be omitted, yielding packaged chips that have no bonding material thereon. The bonding material may be applied to terminals 94 at a later stage of processing, or else may be applied to the circuit board during mounting of the packaged chip. In a further variant, the motion of the wire bonding head is controlled, during application of wire bonds 76 to form the composite leads so as to provide wire bonds that are initially curved in the horizontal direction. Such horizontal curvature can be used in lieu of or in addition to the vertical curvature illustrated in FIG. 5. Where the wire bonds are curved in the horizontal direction, the vertical movement of the second element towards the first element (FIG. 6) need not squash or deform the wire bonds. In this regard, it should be appreciated that wire bonds forming portions of adjacent leads may contact one another at intermediate stages during the process. However, this does not impair the quality of the final product, provided that the leads, in their final condition after movement of the second element away from the first element, do not contact one another.

Figure 10:
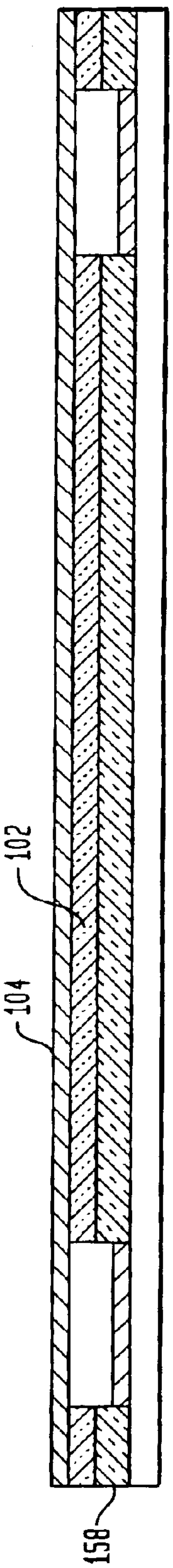
Figure 11:
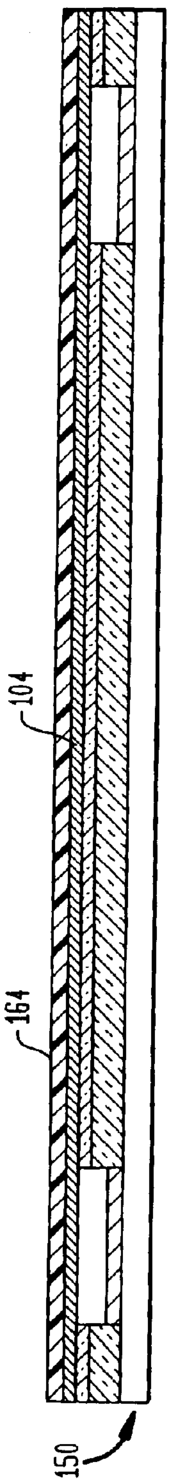
Figure 12:
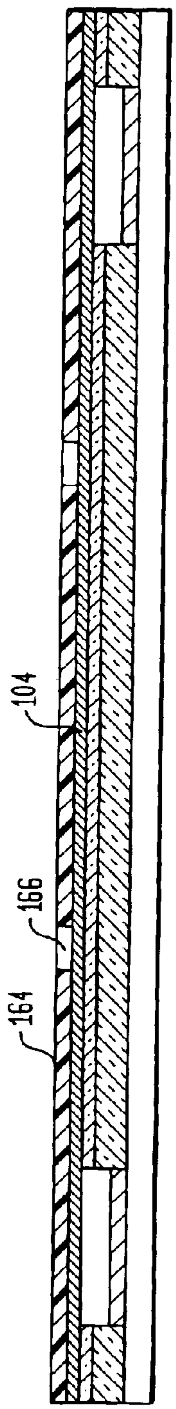

A process in accordance with a further embodiment of the invention begins with a first element 150 incorporating a semiconductor wafer having a passivation layer 152 and contacts 156 exposed to the front surface 154 of the first element through apertures 158 in the passivation layer. These structures may be similar to the corresponding structures discussed above with reference to FIGS. 1–7. In a first stage of the process, a planarizing layer 102 formed from a dielectric material such as benzocyclobutene ("BCB") or other polymeric dielectric is applied over the passivation layer. The polymer layer 102 effectively merges with the passivation layer 152 on the front surface of the first element, but planarizes the structure. Stated another way, the polymeric layer 102 forms a smoother front surface than the passivation layer. After application of the planarizing polymeric layer 102, this layer is etched to form openings in registration with apertures 158, thereby exposing contacts 156 to the front surface of layer 102. A foil formed from one or more conductive, etchable metals such as copper is laminated on the front surface of the first element, over layer 102. As best seen in FIG. 10, portions of the foil extend across apertures 158. Foil 104 is then covered by a resist layer 164 (FIG. 11) and openings 166 (FIG. 12) are formed in this resist layer at locations remote from apertures 158 where bonding material is to be applied. These openings are located at regions of the foil which will form the tip ends of the leads as discussed below. The bonding material 168 is applied as discussed above with reference to FIGS. 3 and 4.

Figure 13:
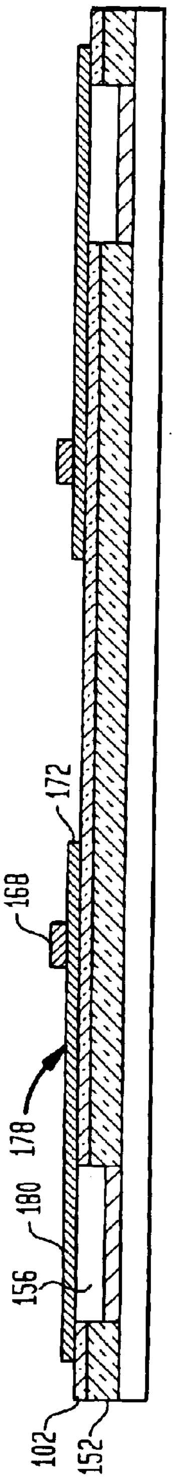
Figure 13A:
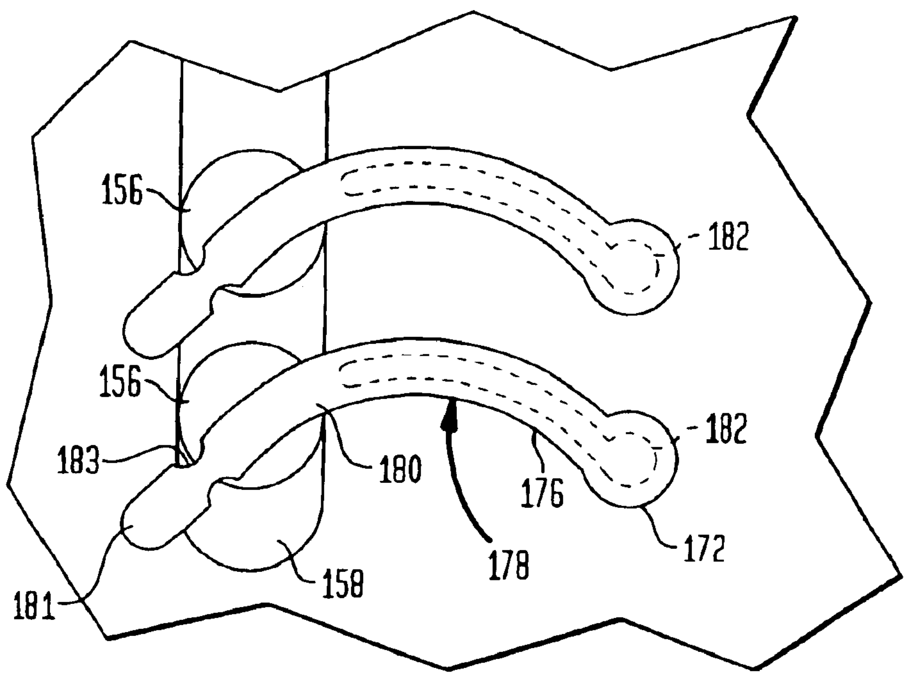
FIG. 13A is a fragmentary plan view of a portion of a component shown in FIG. 13.

After application of the bonding material, resist 164 is further patterned so as to leave portions of the resist overlying regions of the sheet that are to constitute leads and to leave the remaining areas of the sheet exposed. Alternatively, resist 164 may be entirely removed and replaced by a further resist that is patterned in this manner. The foil 104 is then etched so as to form individual leads 178 (FIG. 13). Leads 178 have anchor ends 180 extending over the apertures 156 in passivation layer 152 and dielectric layer 102 and have tip ends 172 remote from the anchor ends. As best seen in FIG. 13A, at this stage of the process each lead 178 also has an elongated main portion 176 extending between the tip end 172 and the anchor end 180. Retainers 181 are formed integrally with leads 176. Each retainer 181 is disposed on the opposite side of an aperture 158 from the main portion 176 and tip end 172 of the lead, so that the anchor end 180 extends from the main portion 176 across the aperture to the retainer 181. Each retainer 181 is connected to the anchor end 180 of the associated lead by a frangible section 183. The frangible section of each lead is weaker than the remainder of the lead, so that the frangible sections can be broken without destroying the other features of the leads. For example, the frangible portions may have cross-sectional areas smaller than the cross-sectional areas of the anchor ends 180 and smaller than the cross-sectional areas of the retainers 181. The leads 178 and, particularly, the main portions 176 of the leads may be curved in horizontal directions. As also seen in FIG. 13*a*, an individual aperture 158 in the dielectric planarization and passivation layers may be in the form of an elongated slot encompassing numerous contacts 156, and several leads may extend across each individual aperture, the anchor end 180 of each such lead being aligned with a different one of the contacts 156.

After formation of the leads, dielectric layer 102 is etched as, for example, by a plasma etching process so as to form small polymeric connecting elements 182 (FIGS. 13*a* and 14) extending between the tip end 172 of each lead and the first element 152. Here again, the etching process begins at the edges of the tip ends and progresses inwardly. The etching process is terminated before the polymeric material underneath the tip ends is entirely removed, thereby leaving small polymeric connectors 182 beneath the tip ends of the leads. The same etching process also progresses inwardly from the sides of the main portion 176 of the leads. Depending upon the widths of the leads and the time at which the etching process is terminated, frangible strips 185 may be formed beneath the main portions of the leads. Retainers 181 may be protected during the etching process so as to assure that each retainer remains firmly connected to the front surface of the first element. At this stage of the process, both ends of each lead are held in place on the front surface of the first element.

Figure 14:
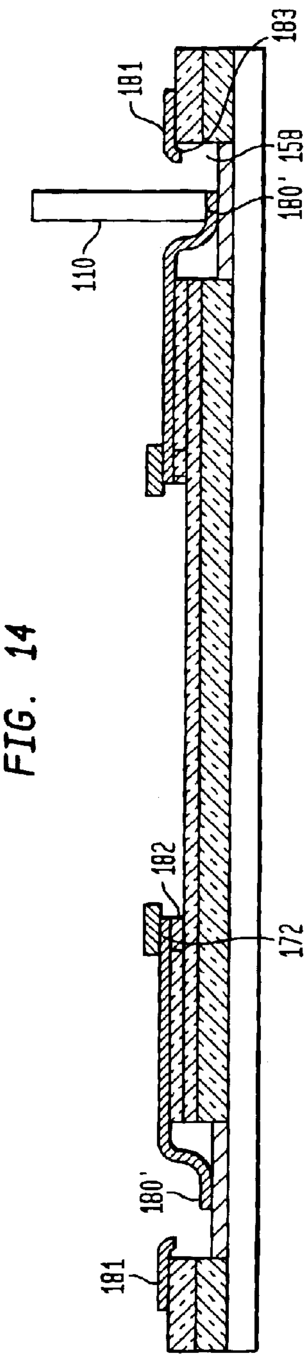
FIGS. 14–16 are views similar to FIGS. 8–13, showing the components at later stages of the method.

In the next stage of the process, the anchor ends 180 are bonded to contacts 156 by displacing the anchor ends downwardly into apertures 158 as indicated at 180' in FIG. 14. This process may be performed on the various leads in sequence, as by engaging the anchor end 180 of each lead with a tool such as an ultrasonic or thermosonic bonding tool 110 and forcing the engaged anchor end downwardly. During this process, the bonding tool constrains and guides the anchor end. This operation may be similar to the processes used to engage connections sections of leads with contacts on chips as taught, for example, in U.S. Pat. Nos. 6,054,756 and 5,915,752, the disclosures of which are incorporated by reference herein. Prior to engagement by the bonding tool, the anchor end of each lead is held in position by the associated retainer 181 and by the main portion 176 and tip end of the lead, so that the anchor ends of the leads may be engaged reliably by the bonding tool. As each anchor end is displaced to the position indicated at 180', the anchor end is detached from the associated retainer 181 by breaking the associated frangible section 183.

Figure 15:
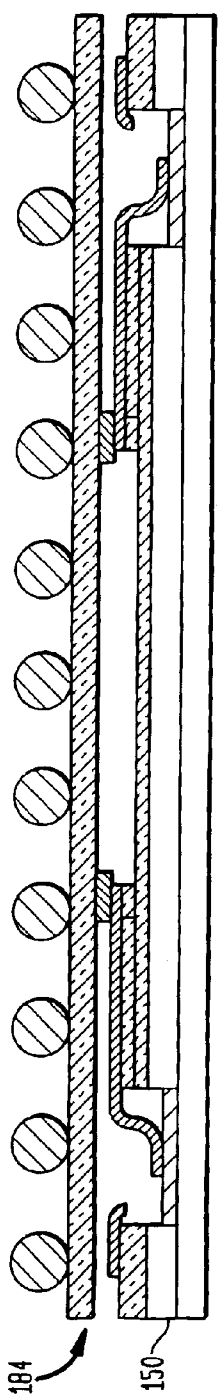
Figure 16:
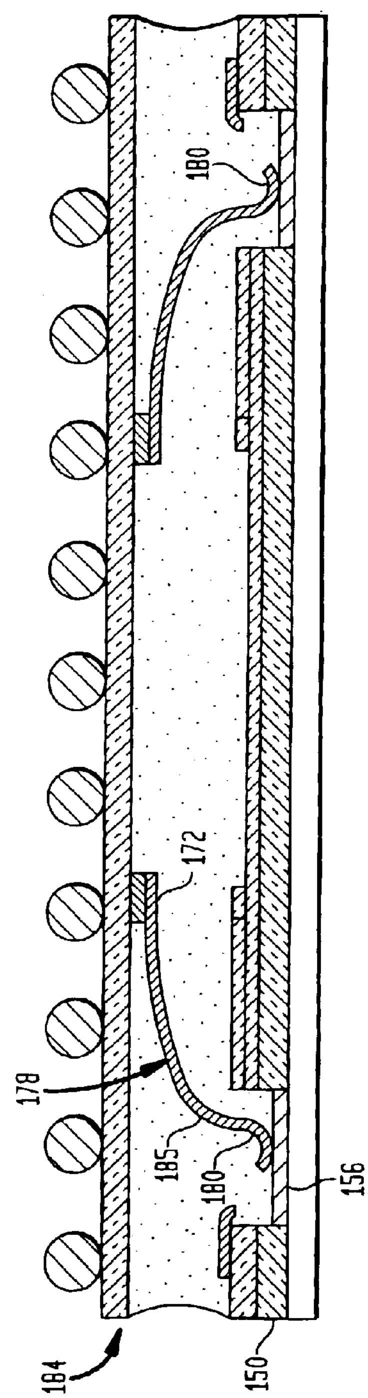

After the anchor ends have been bonded to the contacts, a second microelectronic element 184, which may be similar to the second element discussed above with reference to FIG. 7, is juxtaposed with the first element 150. The tip ends 172 of the leads are bonded to contact pads on the second element in the same manner as discussed above to provide an assembly as seen in FIG. 15. After the tip ends have been bonded to the second element, the second element is moved away from the first element through a pre-determined displacement as seen in FIG. 16. Here again, the anchor ends 180 remain in position, bonded to the contacts 156 of the first element, whereas the tip ends 172 of the leads move upwardly away from the first element. Thus, the leads 178 are deformed into a vertically extensive condition. Desirably, the entire main section 176 of each lead is detached from the front surface of the first element 150, so that the entire length of the lead, between the anchor end 180 and the tip end 172 is free to flex in bending. The vertical movement deforms each lead 178 into the vertically extensive configuration illustrated in FIG. 16. During this vertical movement, the horizontal curvature of the leads (FIG. 13A) may be straightened somewhat so as to provide additional length in the lead required by the vertical extension of the lead. Preferably, the lead is not pulled completely taut, so that some curvature remains.

After movement, the completed leads may have a configuration as illustrated in FIG. 16. Each such lead 178 is formed as a substantially unitary strip that slopes upwardly in the vertical direction toward the second element 184 from its anchor end 180 to its tip end 172. Each such lead has a bend point 185 between the anchor end and the tip end. The vertical slope of the lead changes relatively rapidly at this bend point. Thus, between the bend point 185 and the anchor end of the lead, the vertical slope per unit length of the strip is relatively large. Between the bend point and the tip end 172, the vertical slope is relatively small. There is a substantial change in slope per unit length at the bend point 185.

Figure 17:
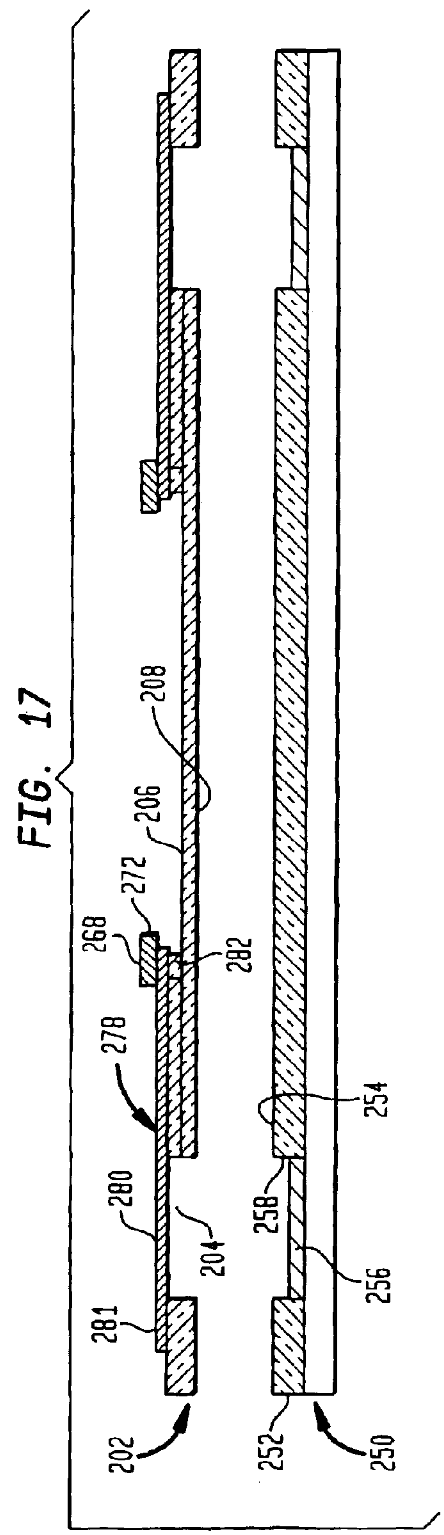
FIGS. 17–21 are diagrammatic sectional views similar to FIG. 1 depicting components used in a method according to yet another embodiment of the invention at successive stages of the method.

A process in accordance with a further embodiment of the invention (FIGS. 17–19) uses a first element 250 similar to that first microelectronic elements discussed above. Here again, the element includes a dielectric passivation layer 252 defining the front surface 254, with contacts 256 exposed through apertures 258 to the front surface. A separately formed carrier sheet 202 is provided with openings 204 corresponding to the apertures 258 in the passivation layer of the first element. Carrier sheet 202 has a front or top surface 206 and a rear or bottom surface 208. Apertures 204 extend between the front surface 206 and the rear surface 208. Leads 278 are provided on the front surface 206. Leads 278 are unitary strips having tip ends 272 and having anchor ends 280 extending across apertures 204 to retainers 281. The configuration of leads 278 may be essentially the same as the configuration of leads 178 discussed above with reference to FIG. 13A. Thus, leads 278 may be curved in horizontal directions. The tip end of each lead is releasably connected to the front surface 206 of sheet 202 by a small polymeric connecting element 282. The tip end of each lead bears an electrically conductive bonding material 268. Carrier sheet 202 and leads 278 may be fabricated using generally conventional processes used for fabricating flexible circuits and tab tapes as, for example, conventional electroplating, photoresist processing and etching procedures. The polymeric connecting elements 282 may be formed by processes directly analogous to those discussed above. Typically, carrier sheet 202 is provided as a large sheet encompassing numerous regions, each such region corresponding to the area occupied by a single chip. Such a sheet can be assembled to an entire wafer, to a section of a wafer or to one or more individual chips previously severed from a wafer.

Figure 18:
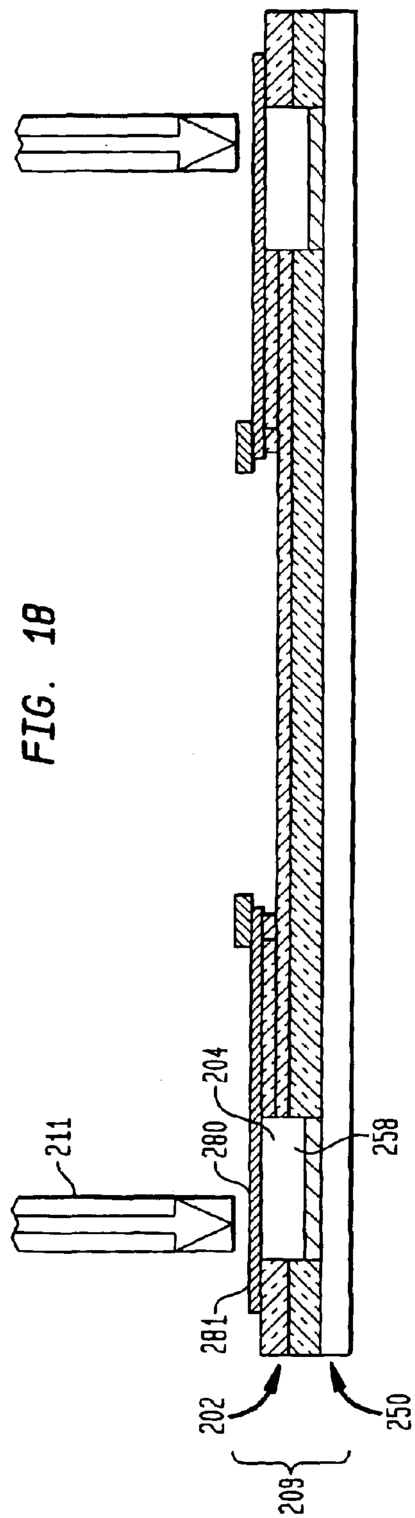
Figure 19:
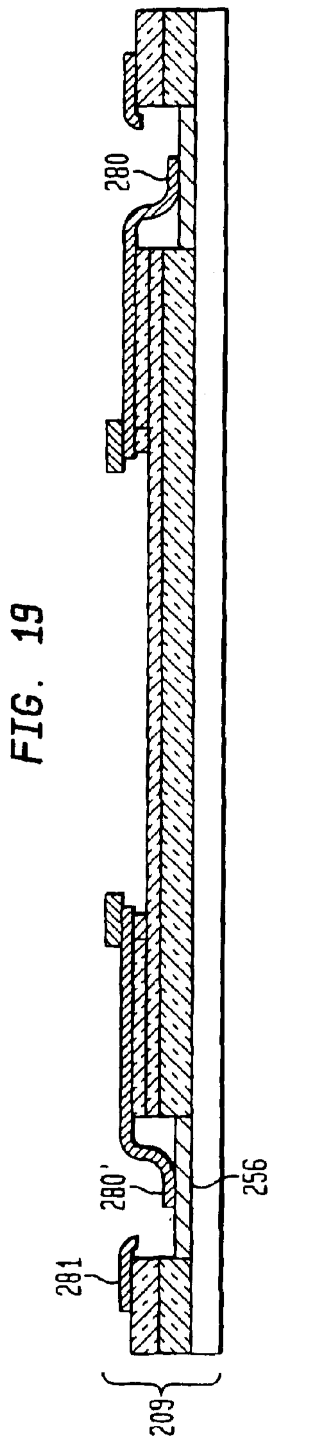
Figure 20:
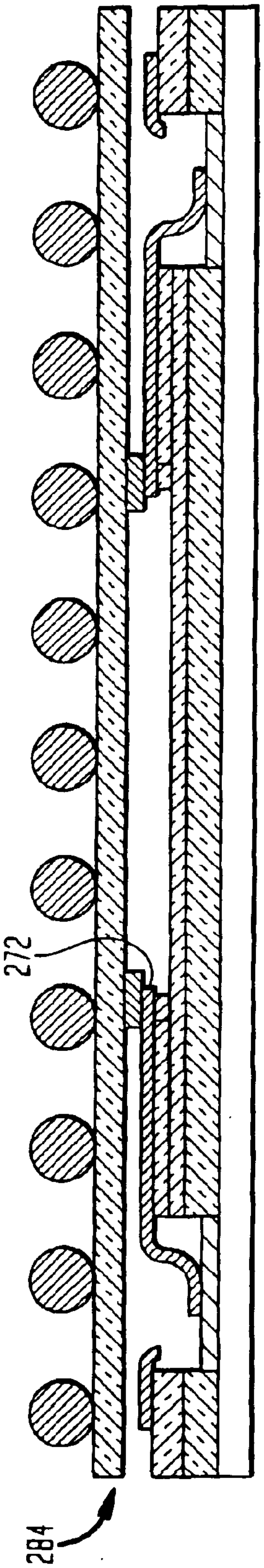
Figure 21:
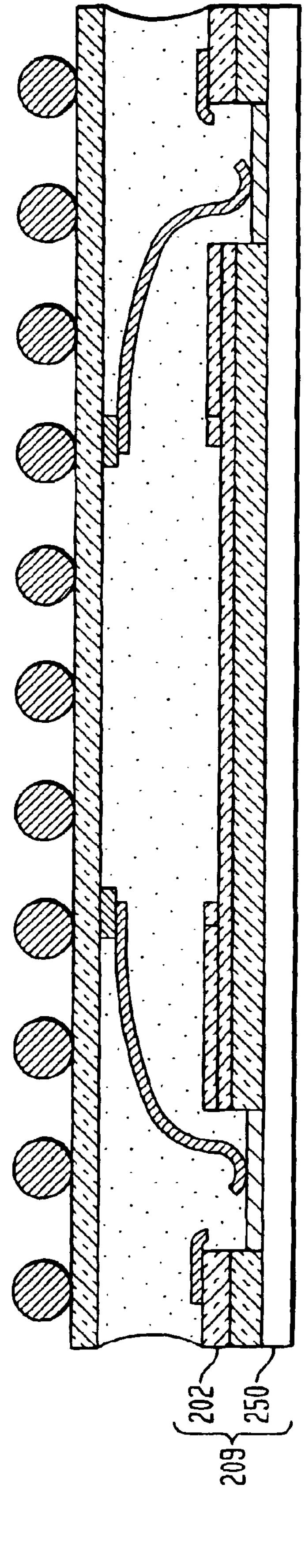

As shown in FIG. 18, sheet 202 is assembled to first element 250 so that the apertures 204 in the sheet are aligned with the apertures 258 in the passivation layer of the first element and so that the anchor ends 280 of the leads are aligned with the contacts 256 of the first element. Desirably, sheet 202 is laminated to the front surface 254 of the first element using a thin layer of an adhesive (not shown). Alternatively, where the carrier sheet includes an uncured or partially-cured polymer at rear surface 208, this polymer may be further cured after assembly of sheet to the first element so as to bond the sheet securely in place on the first element. This lamination produces a subassembly 209 including the carrier sheet and the first element. The subassembly is processed in substantially the same was as described above with reference to FIGS. 14–16. Thus, the anchor end 280 of each lead is engaged with a bonding tool 211 (FIG. 18) and forced downwardly into an aperture 204 of sheet 202 and the aligned aperture 258 of the passivation layer, thereby breaking the anchor end 280 away from the associated retainer 281 and bending the anchor end downwardly to the position indicated at 280' in FIG. 19. Each lead is bonded to the associated contact by applying energy to the lead and contact as, for example, by thermosonic or ultrasonic bonding. Here again, the tip ends 272 of the leads are bonded to a second microelectronic element 284 and the second element is moved upwardly away from the subassembly 209 of the carrier sheet 202 and first element 250, thereby deforming the leads to a vertically extensive disposition.

Figure 22:
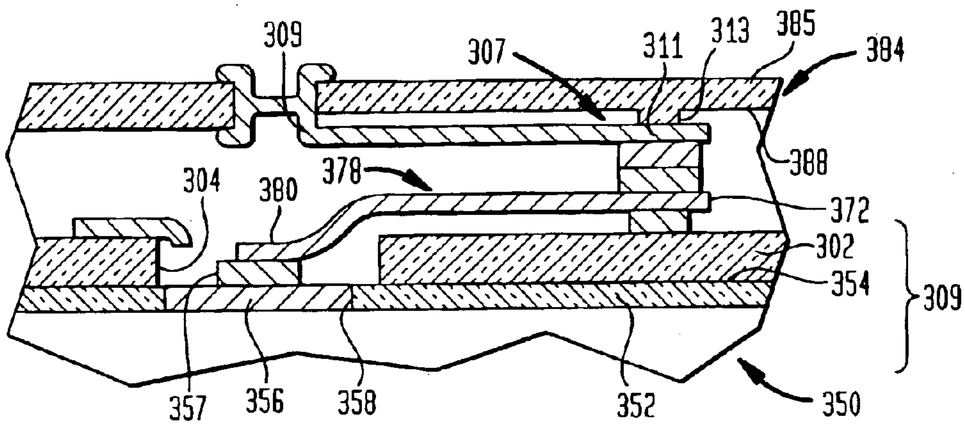
FIGS. 22 and 23 are fragmentary sectional views depicting components according to yet another embodiment of the invention, during successive stages of processing.

A process in accordance with yet another embodiment of the invention uses a carrier sheet 302 substantially identical to the carrier sheet 202 discussed above with reference to FIGS. 17–21, except that carrier sheet 302 (FIG. 22) has leads 278 that may be substantially straight and that may be somewhat shorter than those used in the embodiments discussed above. As in the process of FIGS. 17–21, carrier sheet 302 is assembled to the front surface 354 of a first element 350 so that apertures 304 in the carrier sheet are aligned with apertures 358 in the passivation layer 352 of the first element and so that the anchor ends of leads 378 on the carrier sheet 302 are aligned with contacts 356 of the first element. As discussed above, the anchor ends 380 are bonded to contacts 356 as by displacing the anchor ends downwardly as shown in FIG. 22. Here again, each contact 356 may be provided with a bonding material such as a gold stud 357, a solder mass or the like. The subassembly 309 including the first element 350 and carrier sheet 302 is juxtaposed with a second element 384. Second element 384 includes a body 385 with lead portions 307 disposed on a bottom surface 388 of the body. Each lead portion 307 has a fixed end 309 permanently attached to the body 384 and has a mobile end 311 displaceable relative to the body 384 of the second element. The mobile ends 311 may be connected to body 388 by small polymer connecting elements 313 similar to the connecting elements discussed above. Here again, the mobile ends 311 are temporarily held in place by the connecting elements but can be displaced away from the second element body upon application of a sufficient force. The second element 384 is juxtaposed with the subassembly 309 so that the mobile ends 311 of the lead portions on the second element are aligned with the tip ends 372 of the leads on the subassembly. Bonding material on the tip ends 372 of the subassembly leads, or on the mobile ends 311 of the second element leads, or both, is activated so as to bond the tip ends 372 of leads 378 to the mobile ends 311 of lead portions 307. This joins leads 378 and lead portions 307 into composite leads, each such composite lead including one lead 378 and one lead portion 307.

Figure 23:
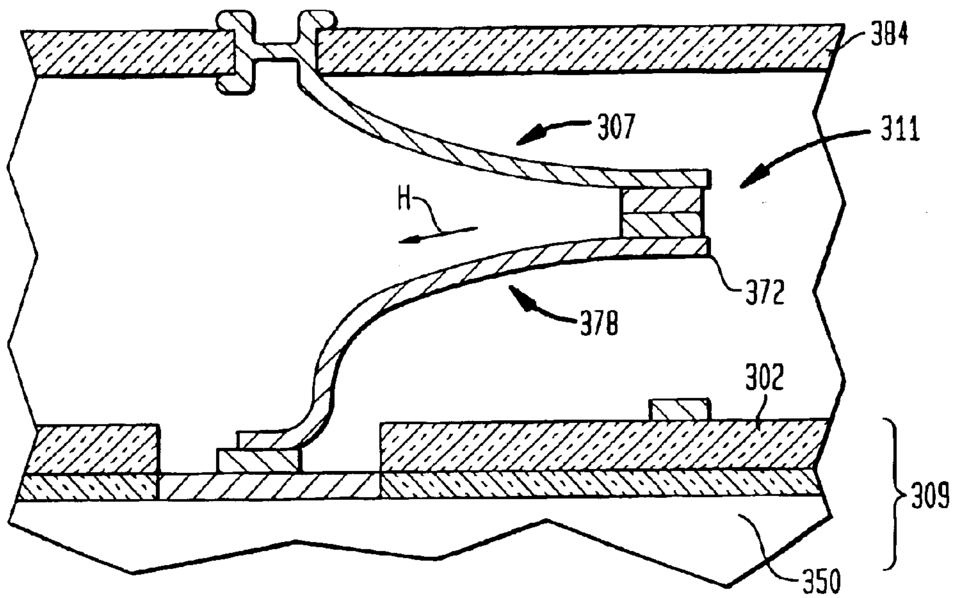

In the next stage of the process, second element body 384 is moved upwardly away from the subassembly 309 of the first element 350 and carrier sheet 302, thereby deforming the composite leads. Each lead 378 originally provided on the carrier sheet is bent upwardly, away from the carrier sheet, whereas each lead portion 307 originally provided on the second element body is bent downwardly away from the second element body. The mobile ends of lead portions 307 are displaced downwardly away from the second element body, whereas the tip ends 372 of the leads originally provided on sheet 302 are bent upwardly, away from the sheet and away from the first element. In this process, the conjoined tip ends and mobile ends may move horizontally relative to the first element 350 and relative to the second element body. Such horizontal movement, in the direction indicated by arrow H in FIG. 23 effectively shortens leads 378 and lead portions 307 in the horizontal direction, compensating for the additional vertical length introduced by the vertical movement of the second element body.

Figure 24:
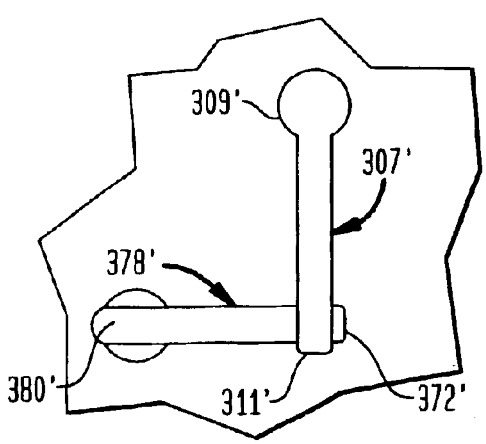
FIG. 24 is a fragmentary plan view depicting components according to yet another embodiment of the invention.

Numerous variations and combinations of the features described above can be utilized. For example, as seen in FIG. 24, leads 378' provided on the subassembly 309 used in the embodiment of FIGS. 22 and 23 may extend in horizontal directions transverse to the directions of lead portions 307' on the second element body. Thus, when the tip ends 372' of leads 378' joined with the mobile ends 311' of lead portions 307', leads 378' and lead portions 307' form a generally L-shaped composite lead. As described in co-pending commonly assigned U.S. patent application Ser. No. 09/271,688, the disclosure of which is hereby incorporated by reference herein, such an L-shaped lead can be deformed to a vertically extensive disposition as by moving the second element body so as to displace the fixed ends 309' of the lead portions 307' upwardly away from the anchor ends 380' of leads 378'. As discussed in co-pending commonly assigned U.S. patent application Ser. No. 09/317,675, the disclosure of which is hereby also incorporated by reference herein, leads and lead portions that extend transversely to one another can provide a relatively tolerance-insensitive system, so that the tip ends and mobile ends can be joined with one another, even where the leads or lead portions are out of nominal position.

In a further variant, stub leads similar to the stub leads 70 discussed above with reference to FIG. 5, can be provided on a carrier sheet similar to the carrier sheets 202 and 302 discussed above with reference to FIGS. 17–23. Such stub leads can be connected to contacts on the first element by wire bonds as described above with reference to FIGS. 5–7, and the resulting assemblies can be bonded to second elements by the processes described with reference to FIGS. 20–24.

In the embodiments discussed above, the tip ends of the leads on the first elements and carrier sheets and the mobile ends of the leads on the second element body (FIGS. 22–23) are temporarily retained in position by small polymeric connecting elements. Other ways of providing displaceable lead ends that are temporarily retained in position can be employed. For example, as disclosed in U.S. Pat. No. 5,763,941, the disclosure of which is hereby incorporated by reference herein, the tip ends or mobile ends may be weakly attached to the underlying surface as, for example, by forming the tip ends over a release layer that provides only weak adhesion between the metal of the lead and the underlying layer. Also, as described in U.S. patent application Ser. No. 09/577,474, the disclosure of which is hereby incorporated by reference herein, the lead ends may be exposed to heat or other energy so as to loosen the bond between the lead end and the underlying layer. Further, as described in certain embodiments of U.S. Pat. No. 5,518,964, the leads may be formed over a layer of a sacrificial metal and the sacrificial metal may be etched beneath the lead so as to form connectors or buttons having horizontal sizes smaller than the tip ends of the leads. For example, leads formed from gold can be plated over a copper layer and the copper layer can be etched away so as to leave small connectors formed from copper between the tip end of each lead and the underlying layer.

In the embodiments discussed above, the first element is illustrated as a section of a wafer. However, the same techniques can be used to form assemblies from microelectronic elements such as individual chips. The second element need not be a connection component having terminals suitable for connection to a circuit panel. For example, the second microelectronic element may be another semiconductor chip or wafer, or a passive electronic component.

As these and other variations and combinations of the features discussed above can be utilized without departing from the present invention, as defined by the claims. The foregoing description of the preferred embodiments should be taken by way of illustration rather than by way of limitation of the invention as defined by the claims.

What is claimed is:

1. A method of providing leads on a first microelectronic element having a body with a top surface and a plurality of contacts exposed at said front surface, the method comprising:

(a) assembling a carrier sheet formed separately from said microelectronic element to the top surface of the microelectronic element, said sheet having a bottom surface and a top surface, said carrier sheet having leads overlying its top surface when said carrier sheet is assembled to said microelectronic element, said leads having tip ends, the tip ends of said leads being displaceable upwardly with respect to said carrier sheet;

(b) securing said carrier sheet to said top surface; and (c) electrically connecting at least some of said leads to at least some of said leads to said contacts on said first microelectronic element.

2. A method as claimed in claim 1 further comprising the steps of connecting at least some of the tip ends of the leads on said carrier sheet to a second microelectronic element overlying said top surface of said carrier sheet, and then moving said second microelectronic element vertically relative to the carrier sheet and first microelectronic element so as to move the tip ends of the leads upwardly away from the carrier sheet.

3. A method as claimed in claim 2 wherein, when said carrier sheet is assembled to said first microelectronic element, at least some of said leads are full leads having anchor ends remote from said tip ends, said step of electrically connecting at least some of said leads to said contacts including bonding the anchor ends of at least some of said full leads to at least some of said contacts.

4. A method as claimed in claim 3 wherein said step of bonding at least some of said anchor ends to at least some of said contacts is performed before said step of connecting at least some of the tip ends of the leads to said second microelectronic element.

5. A method as claimed in claim 3 wherein, during said moving step, at least some of said full leads are entirely detached from the carrier sheet.

6. A method as claimed in claim 3 wherein said step of bonding said anchor ends of said leads to said contacts includes bonding a plurality of said anchor ends to a plurality of said contacts simultaneously.

7. A method as claimed in claim 6 wherein, when said carrier sheet is assembled to said first microelectronic element, a bonding material is present: (i) on at least some of said contacts; (ii) on at least some of said anchor ends; or (iii) both (i) and (ii), and wherein step of bonding said anchor ends to said contacts including activating said bonding material.

8. A method as claimed in claim 7 wherein said bonding material includes solder.

9. A method as claimed in claim 7 wherein said bonding material includes gold bumps on said contacts.

10. A method as claimed in claim 3 or claim 4 or claim 5 wherein said step of bonding said anchor ends of said leads to at least some of said contacts includes bending said anchor ends of said leads downwardly towards said contacts.

11. A method as claimed in claim 10 wherein said step of bonding said anchor ends of said leads to at least some of said contacts includes forcibly engaging said anchor ends of at least some of said leads with at least some of said contacts while applying energy to the engaged anchor ends and contacts.

12. A method as claimed in claim 11 wherein said step of forcibly engaging said anchor ends is performed by engaging individual ones of said anchor ends with a tool seriatim and forcing said anchor ends downwardly.

13. A method as claimed in claim 2 wherein, when said carrier sheet is assembled to said first microelectronic element, at least some of said leads are stub leads having bonding terminals offset from said tip ends, said step of electrically connecting at least some of said leads to at least some of said terminals including connecting additional lead portions separate from said carrier sheet between the bonding terminals of at least some of said stub leads and at least some of said contacts so as to form composite leads extending between said contacts and said tip ends.

14. A method as claimed in claim 13 wherein said step of connecting additional lead portions is performed before said step of connecting at least some of the tip ends of the leads to said second microelectronic element.

15. A method as claimed in claim 13 wherein said step of connecting additional lead portions is performed by wire-bonding, so as to leave bonding wires extending between said contacts and said bonding terminals.

16. A method as claimed in claim 13 wherein, during said moving step, at least some of said stub leads are detached from said carrier sheet.

17. A method as claimed in claim 2 wherein said second microelectronic element includes a second-element body and lead portions having fixed ends attached to the second element-body and having mobile ends displaceable relative to the second-element body, said step of connecting said tip ends of said leads on said carrier sheet to said second microelectronic element including connecting said tip ends to said mobile ends, said mobile ends being displaced downwardly relative to said second-element body during said moving step.

18. A method as claimed in claim 1 wherein, when said carrier sheet is assembled to the first microelectronic element, the tip ends of at least some of said leads are releasably connected to the carrier sheet.

19. A method as claimed in claim 1 wherein said first microelectronic element is an active semiconductor element including a plurality of active semiconductor devices.

20. A method as claimed in claim 19 wherein said first microelectronic element is a unitary wafer incorporating a plurality of semiconductor chips.

21. A method as claimed in claim 19 wherein said first microelectronic element includes a plurality of discrete semiconductor chips.

22. A method of making a microelectronic assembly comprising:

(a) providing a sheet overlying a front surface of a first microelectronic element, said sheet having leads on a top surface facing away from said first microelectronic element, at least some of said leads having anchor ends projecting downwardly into apertures in said sheet and bonded to contacts of said first microelectronic element and having tip ends remote from said anchor ends;

(b) connecting at least some of the tip ends of the leads to a second microelectronic element, and then moving said second microelectronic element vertically relative to the sheet and first microelectronic element so as to move the tip ends of the leads upwardly away from the sheet and first microelectronic element;

wherein at least some of said leads are entirely detached from the sheet during said moving step; and wherein said providing step includes providing said leads with said anchor ends projecting over said apertures, bending said anchor ends of said leads downwardly into said apertures in said carrier sheet into engagement with said contacts and bonding the engaged leads and contacts.

23. A method as claimed in claim 22 wherein said step of bonding said anchor ends of said leads to said contacts includes forcibly engaging said anchor ends with said contacts while applying energy to the engaged anchor ends and contacts.

24. A method of making a microelectronic assembly comprising:

(a) providing a sheet overlying a front surface of a first microelectronic element, said sheet having stub leads on a top surface facing away from said first microelectronic element, said stub leads having tip ends and bonding terminals offset from said tip ends;

(b) connecting additional lead portions separate from said sheet and stub leads between the bonding terminals of at least some of said stub leads and at least some of said contacts so as to form composite leads extending between said contacts and said tip ends;

(c) connecting at least some of the tip ends of the leads to a second microelectronic element, and then moving said second microelectronic element vertically relative to the sheet and first microelectronic element so as to move the tip ends of the leads upwardly away from the sheet and first microelectronic element.

25. A method as claimed in claim 24 wherein said step of connecting said tip ends to a second microelectronic element includes advancing the second microelectronic element towards the sheet and the first microelectronic element, said second microelectronic element engaging and deforming at least some of said additional lead portions during said advancing step.

26. A method as claimed in claim 24 or claim 25 wherein said step of connecting additional lead portions is performed by wire-bonding, so as to leave bonding wires extending between said contacts and said bonding terminals.

27. A method as claimed in claim 24 wherein at least some of said stub leads are entirely detached from the sheet during said moving step.

28. A method as claimed in claim 27 further comprising removing said sheet after said moving step.

29. A method as claimed in claim 28 wherein said sheet is rigid.

30. A method as claimed in claim 28 wherein said sheet and said first microelectronic elements have substantially equal coefficients of thermal expansion.

* * * * *

UNITED STATES PATENT AND TRADEMARK OFFICE
CERTIFICATE OF CORRECTION

PATENT NO. : 6,939,735 B2
DATED : September 6, 2005
INVENTOR(S) : John W. Smith and Mitchell Koblis It is certified that error appears in the above-identified patent and that said Letters Patent is hereby corrected as shown below:

Column 3,
Line 40, "ends the leads" should read -- ends of the leads --.

Column 4,
Line 31, "anchor ends are" should read -- anchor ends, are --.

Column 10,
Line 64, "the leads may" should read -- the leads, may --.

Column 14,
Line 65, "As these and" should read -- These and --.

Column 15,
Lines 19-20, "said leads to at least some of said leads to said contacts" should read -- said leads to said contacts --.

Signed and Sealed this

Twenty-first Day of February, 2006

JON W. DUDAS
*Director of the United States Patent and Trademark Office*